(12) United States Patent
Nakazawa

(10) Patent No.: US 8,946,841 B2
(45) Date of Patent: Feb. 3, 2015

(54) SOLID-STATE IMAGING ELEMENT AND ELECTRONIC DEVICE INCLUDING A PIXEL SEPARATING SECTION

(71) Applicant: Sony Corporation, Tokyo (JP)

(72) Inventor: Masashi Nakazawa, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/750,693

(22) Filed: Jan. 25, 2013

(65) Prior Publication Data

US 2013/0193547 A1   Aug. 1, 2013

(30) Foreign Application Priority Data

Jan. 30, 2012  (JP) ................. 2012-016263

(51) Int. Cl.
*H01L 31/0232* (2014.01)
(52) U.S. Cl.
USPC ............ 257/432; 257/431; 257/443; 257/447
(58) Field of Classification Search
CPC .............. H01L 27/1463; H01L 31/18; H01L 27/14689; H01L 27/1464; H01L 27/14621
USPC .......... 257/228, 292, 460, 431–432, 440–447
See application file for complete search history.

(56) References Cited

U.S. PATENT DOCUMENTS

| | | | |
|---|---|---|---|
| 2010/0079638 A1* | 4/2010 | Hwang | 348/294 |
| 2010/0155796 A1* | 6/2010 | Koike et al. | 257/292 |
| 2010/0177231 A1* | 7/2010 | Tsuchida | 348/308 |
| 2011/0042552 A1* | 2/2011 | Furuya et al. | 250/208.1 |
| 2011/0089313 A1* | 4/2011 | Oshiyama et al. | 250/208.1 |

FOREIGN PATENT DOCUMENTS

JP   2010-536187   11/2010

* cited by examiner

*Primary Examiner* — Dung A. Le
(74) *Attorney, Agent, or Firm* — Dentons US LLP

(57) ABSTRACT

Disclosed herein is a solid-state imaging element including: a semiconductor layer; a plurality of photoelectric conversion sections arranged within the semiconductor layer; and a pixel separating section disposed in a shape of a same width from a light receiving surface of the semiconductor layer to an opposite surface of the semiconductor layer from the light receiving surface in a position of separating the photoelectric conversion sections from each other for each pixel, the pixel separating section being formed by a material including an impurity.

10 Claims, 13 Drawing Sheets

SOLID-STATE IMAGING ELEMENT AND ELECTRONIC DEVICE INCLUDING A PIXEL SEPARATING SECTION

BACKGROUND

The present technology relates to a solid-state imaging element, a method for manufacturing the solid-state imaging element, and an electronic device, and particularly to a solid-state imaging element having a pixel separating section for separating photoelectric conversion sections from each other for each pixel, a method for manufacturing the solid-state imaging element, and an electronic device using this solid-state imaging element.

When a pixel separating section is formed within a semiconductor layer in which a plurality of photoelectric conversion sections are formed in a solid-state imaging element, ion implantation is performed a plurality of times with implantation energy varied. At this time, the deeper a position in the semiconductor layer, the higher the energy of the ion implantation. Thus, the deeper the position in the semiconductor layer, the wider the spread in a horizontal direction of an impurity being introduced. Thereby, the deeper the position in the semiconductor layer, the wider in the horizontal direction the shape of an impurity region being formed. After the ion implantation, the impurity is diffused by activating annealing, so that the impurity region expands. As a result of the above, the pixel separating section is formed which has a shape that becomes wider in the horizontal direction at a deeper position in the semiconductor layer, and which is further expanded by the diffusion of the impurity. Such a pixel separating section reduces the capacity of the photoelectric conversion sections within the semiconductor layer, thus inviting a decrease in amount of saturation charge (Qs). In a solid-state imaging element having a minute pixel size, in particular, the ratio of such a pixel separating section is increased, and thus such a pixel separating section has a great effect on the decrease in Qs.

Accordingly, in order to miniaturize the pixel separating section, the following method for forming a pixel separating section has been proposed instead of the ion implantation as described above. First, isolating trenches are formed between pixels in a semiconductor substrate from the surface side of the semiconductor substrate. Next, a diffusion part is formed by doping the side walls and bottom parts of the isolating trenches with a dopant (impurity) of a first conductivity type, and then the isolating trenches are backfilled with an isolation material such as silicon oxide, polysilicon, or the like. In addition, a diffusion part (photoelectric conversion section) of a second conductivity type is formed on the surface side of the semiconductor substrate for each pixel. Further, a diffusion part of the first conductivity type is formed from the backside of the semiconductor substrate. Thereafter, a deep thermal drive is applied to bring the diffusion parts of the first conductivity type closer to each other, the diffusion parts of the first conductivity type being formed from the surface side and the backside, respectively, of the semiconductor substrate. Further, contact pads in electric contact with the diffusion part of the first conductivity type and the diffusion part of the second conductivity type, respectively, are thereafter formed on the surface of the semiconductor substrate (see JP-T-2010-536187).

SUMMARY

However, in the above-described method for manufacturing the solid-state imaging element, high-temperature processing is performed by forming the contact pads after forming the pixel separating section. Thus, the impurity diffuses and the diffusion parts expand. Such expansion of the diffusion parts in the side walls of the isolating trenches reduces the capacity of the photoelectric conversion section, thus inviting a decrease in amount of saturation charge (Qs).

It is accordingly desirable to provide a solid-state imaging element having a pixel separating section for separating photoelectric conversion sections from each other for each pixel in which solid-state imaging element the pixel separating section of a minute shape enables a capacity of the photoelectric conversion sections to be secured and thus an amount of saturation charge (Qs) is improved. It is also desirable to provide a method for manufacturing a solid-state imaging element having such a constitution.

According to an embodiment of the present technology, there is provided a solid-state imaging element including: a semiconductor layer; a plurality of photoelectric conversion sections arranged within the semiconductor layer; and a pixel separating section for separating the photoelectric conversion sections from each other for each pixel. The pixel separating section is disposed in a shape of a same width from a light receiving surface of the semiconductor layer to an opposite surface of the semiconductor layer in a position of separating the photoelectric conversion sections from each other for each pixel. In addition, the pixel separating section is formed by a material including an impurity.

The solid-state imaging element having such a constitution has the pixel separating section disposed in the shape of the same width from the light receiving surface of the semiconductor layer to the opposite surface of the semiconductor layer. Thus, because pixels are separated from each other by the pixel separating section of a uniform width, a uniform width of the photoelectric conversion sections can also be ensured.

Another embodiment of the present technology is a method for manufacturing the solid-state imaging element described above, in which method the following procedure is performed. First, a plurality of photoelectric conversion sections are arranged and formed within a semiconductor layer. Next, a wiring layer is formed on an opposite surface side of the semiconductor layer from a light receiving surface of the semiconductor layer. After the wiring layer is formed, a trench having an opening on a side of the light receiving surface of the semiconductor layer is formed in a position of separating the photoelectric conversion sections from each other for each pixel. Next, a material layer including an impurity is formed in a state of filling the trench. Thereafter, a pixel separating section is formed by selectively heating the semiconductor layer and the material layer including the impurity in relation to the wiring layer.

In such a method for manufacturing the solid-state imaging element, the pixel separating section is formed so as to fill the trench. The pixel separating section in the shape of a uniform width in a depth direction is therefore formed. In addition, after the wiring layer is formed, that is, after a process involving high-temperature processing is completed, the pixel separating section is formed. Thus, the impurity included in the pixel separating section does not diffuse, nor does the pixel separating section expand. A minute pixel separating section is therefore formed.

According to the present technology described above, the photoelectric conversion sections are separated from each other for each pixel by a minute pixel separating section of a uniform width, and thus a capacity of the photoelectric conversion sections can be secured. This improves an amount of saturation charge (Qs). Therefore the sensitivity of the solid-state imaging element can be improved.

DETAILED DESCRIPTION OF THE PREFERRED EMBODIMENTS

Preferred embodiments of the present technology will hereinafter be described in the following order with reference to the drawings.

1. Example of General Configuration of Solid-State Imaging Element according to Embodiment
2. First Embodiment (Example of Constitution Having Pixel Separating Section Formed by Crystalline Semiconductor Including Impurity)
3. Second Embodiment (Example of Constitution with Pixel Separating Section Disposed Deeper than Photoelectric Conversion Section)
4. Third Embodiment (Example of Constitution Having Interface Impurity Layer Continuous with Pixel Separating Section)
5. Fourth Embodiment (Example of Constitution Having Pixel Separating Section Formed by Insulating Material Including Impurity and Impurity Region in Side Wall)
6. Fifth Embodiment (Example of Electronic Device Using Solid-State Imaging Element Obtained by Applying Present Technology)

Incidentally, constituent elements common to the embodiments are identified by the same reference symbols, and repeated description thereof will be omitted.

1. Example of General Configuration of Solid-State Imaging Element According to Embodiment FIG. 1 shows a general configuration using a MOS type solid-state imaging element provided as an example of a solid-state imaging element according to an embodiment of the present technology.

Figure 1:
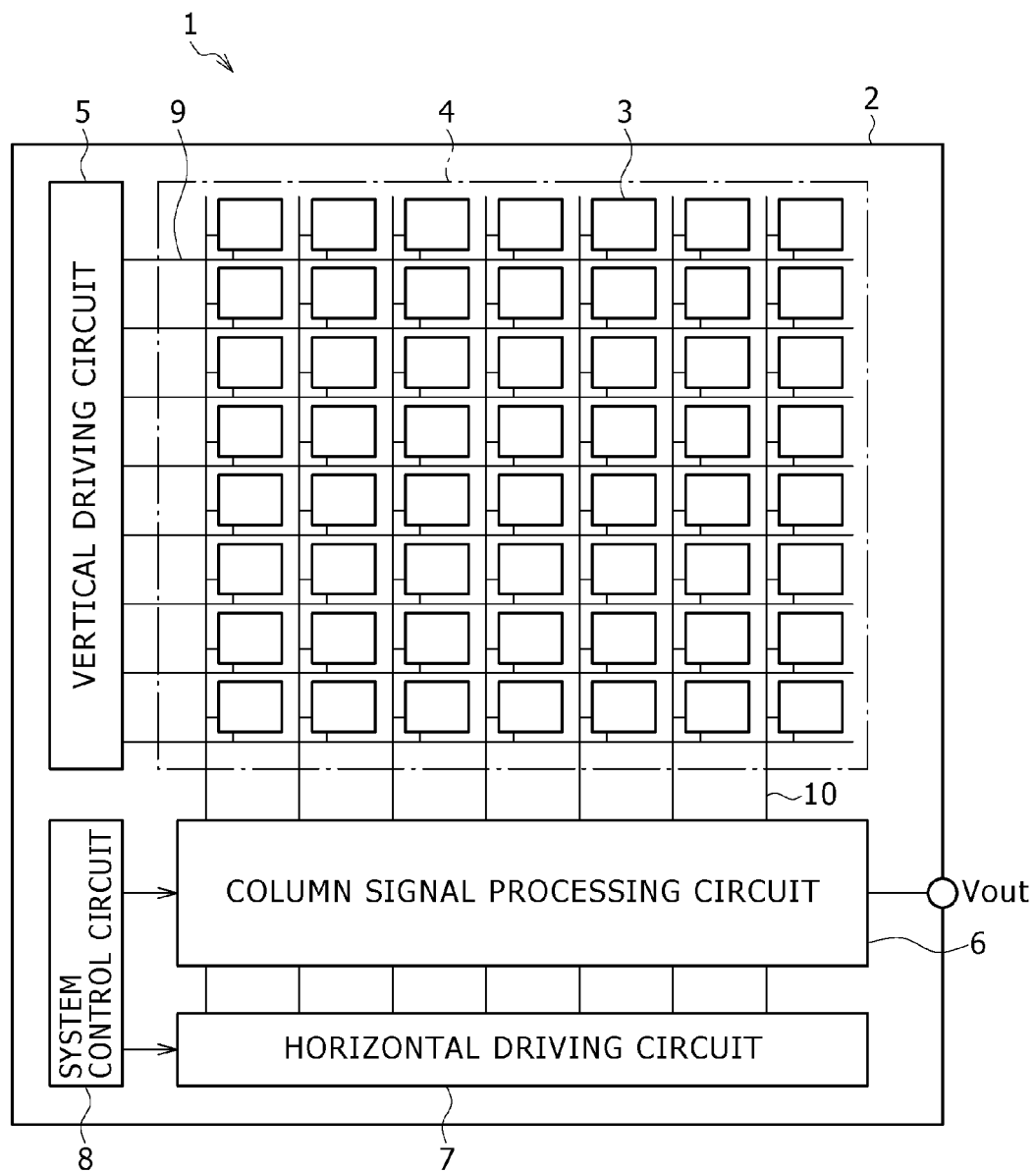
FIG. 1 is a schematic configuration diagram of a solid-state imaging element to which the present technology is applied.

The solid-state imaging element 1 shown in FIG. 1 has a pixel region 4 in which a plurality of pixels 3 including a photoelectric conversion region are arranged two-dimensionally on one surface of a supporting substrate 2. Each of the pixels 3 arranged in the pixel region 4 is provided with a pixel circuit including a photoelectric conversion region, a floating diffusion, a readout gate, a plurality of other transistors (so-called MOS transistors), a capacitance element, and the like. Incidentally, there may be a case where a part of a pixel circuit is shared by a plurality of pixels 3.

Peripheral circuits such as a vertical driving circuit 5, a column signal processing circuit 6, a horizontal driving circuit 7, a system control circuit 8, and the like are provided in a peripheral part of the pixel region 4 as described above.

The vertical driving circuit 5 is formed by a shift register, for example. The vertical driving circuit 5 selects a pixel driving line 9, supplies the selected pixel driving line 9 with a pulse for driving pixels 3, and drives the pixels 3 arranged in the pixel region 4 in a unit of a row. That is, the vertical driving circuit 5 sequentially selects and scans each of the pixels arranged in the pixel region 4 in a unit of a row in a vertical direction. Then, a pixel signal based on a signal charge generated according to an amount of light received in each of the pixels 3 is supplied to the column signal processing circuit 6 through vertical driving lines 10 arranged so as to be perpendicular to the pixel driving lines 9.

The column signal processing circuit 6 is arranged for example for each column of the pixels. The column signal processing circuit 6 subjects signals output from the pixels 3 of one row to signal processing such as noise removal and the like for each pixel column. Specifically, the column signal processing circuit 6 performs signal processing such as correlated double sampling (CDS) for removing fixed pattern noise unique to the pixels, signal amplification, analog/digital conversion (AD), and the like.

The horizontal driving circuit 7 is formed by a shift register, for example. The horizontal driving circuit 7 selects each part of the column signal processing circuit 6 in order by sequentially outputting a horizontal scanning pulse, and makes the pixel signals output from each part of the column signal processing circuit 6.

The system control circuit 8 receives an input clock and data indicating an operation mode and the like, and outputs data such as internal information of the solid-state imaging element 1 and the like. Specifically, the system control circuit 8 generates a clock signal serving as a reference for the operation of the vertical driving circuit 5, the column signal processing circuit 6, the horizontal driving circuit 7, and the like and a control signal on the basis of a vertical synchronizing signal, a horizontal synchronizing signal, and a master clock. The system control circuit 8 then inputs these signals to the vertical driving circuit 5, the column signal processing circuit 6, the horizontal driving circuit 7, and the like.

The peripheral circuits 5 to 8 and the pixel circuits disposed in the pixel region 4 as described above form driving circuits for driving each pixel. Incidentally, the peripheral circuits 5 to 8 may be disposed in such a position as to be laminated to the pixel region 4.

2. First Embodiment

2-1. Constitution of Solid-State Imaging Element 1-1

(Example of Constitution Having Pixel Separating Section Formed by Crystalline Semiconductor Including Impurity)

Figure 2A:
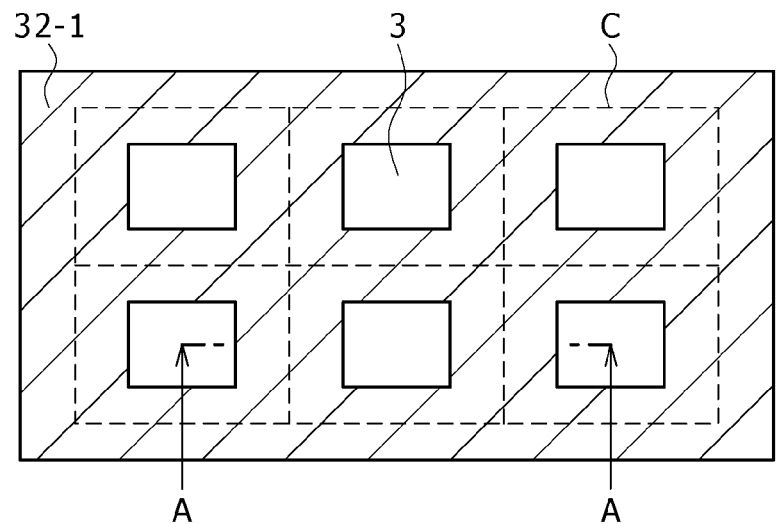
FIGS. 2A and 2B are a fragmentary plan view and a fragmentary sectional view of a constitution of a solid-state imaging element according to a first embodiment.
Figure 2B:
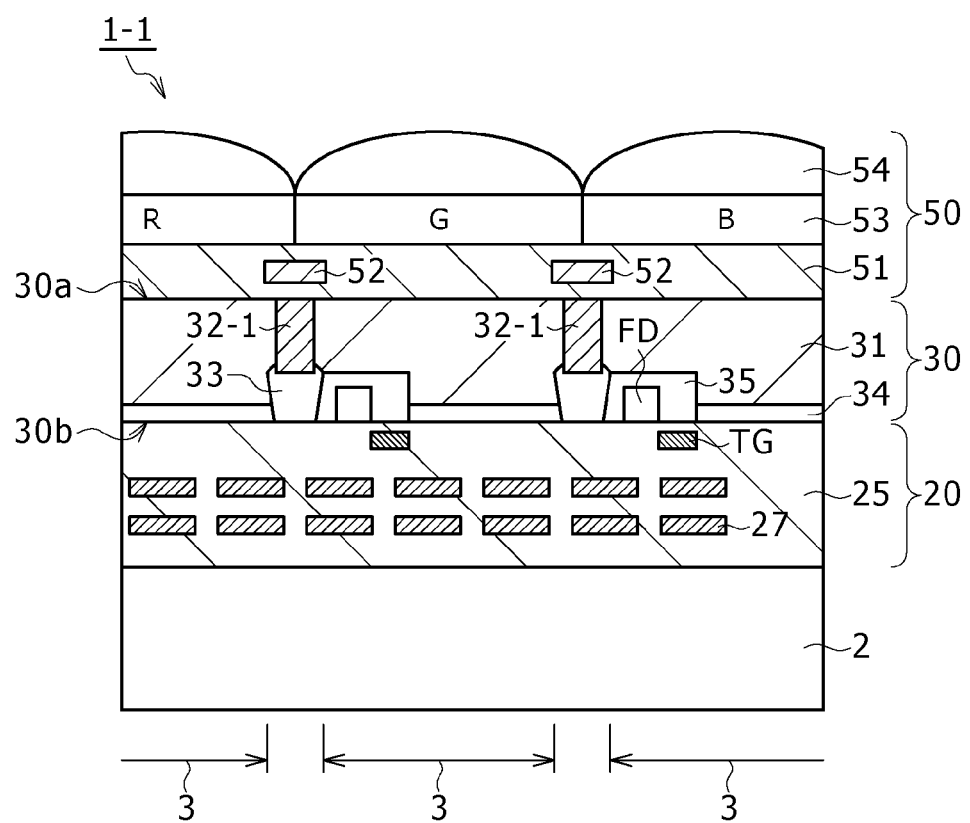

FIGS. 2A and 2B are diagrams showing a constitution of a solid-state imaging element 1-1 according to a first embodiment. FIG. 2A is a fragmentary plan view of six pixels when the part of a semiconductor layer in the solid-state imaging element is viewed in plan from the side of a light receiving surface. FIG. 2B is a fragmentary sectional view corresponding to a section taken along a line A-A of FIG. 2A. The constitution of the solid-state imaging element 1-1 according to the first embodiment will be described in the following with reference to these drawings.

As shown in FIG. 2B, the solid-state imaging element 1-1 according to the first embodiment is a back side illumination type solid-state imaging element 1-1 including a wiring layer 20, a semiconductor layer 30, and an optical layer 50 laminated in this order on the supporting substrate 2 and having a surface of the semiconductor layer 30 on an opposite side from the wiring layer 20 as a light receiving surface 30a. The solid-state imaging element 1-1 has a pixel separating section 32-1 disposed within the semiconductor layer 30. The constitution of each layer will be described in the following in order of the semiconductor layer 30, a plurality of impurity regions 31 to 35 and an FD disposed within the semiconductor layer 30, the wiring layer 20, and the optical layer 50.
[Semiconductor Layer 30]

The semiconductor layer 30 is formed by a crystalline semiconductor, and is for example formed by n-type single crystal or polycrystalline silicon. In the semiconductor layer 30, a surface on the side on which the wiring layer 20 is laminated is a surface 30b, and another surface is the light receiving surface 30a. The p-type or n-type impurity regions 31 to 35 and FDs to be described later are arranged within such a semiconductor layer 30.
[Photoelectric Conversion Section 31]

Photoelectric conversion sections 31 are provided for each of the pixels 3, and are a plurality of impurity regions (of for example an n-type) arranged two-dimensionally with respect to the light receiving surface 30a within the semiconductor layer 30. A photoelectric conversion section 31 accumulates a charge obtained by photoelectric conversion of incident light from the light receiving surface 30a. Such a photoelectric conversion section 31 and an impurity region of an opposite conductivity type which impurity region is in contact with the photoelectric conversion section 31 form a photodiode PD with a pn junction.
[Pixel Separating Section 32-1]

A pixel separating section 32-1 is disposed in such a position as to separate the plurality of photoelectric conversion sections 31 from each other for each of the pixels 3 within the semiconductor layer 30, and is an impurity region of an opposite conductivity type (for example a p-type) from the photoelectric conversion sections 31. As shown in FIG. 2A, the pixel separating section 32-1 is disposed between adjacent pixels 3 so as to surround each of the pixels 3. The pixels 3 are separated from each other by the pixel separating section 32-1. In addition, the pixel separating section 32-1 is provided as an impurity region of the p-type as the opposite conductivity type from the n-type photoelectric conversion sections 31. The pixel separating section 32-1 thereby electrically separates the photoelectric conversion sections 31 from each other for each of the pixels 3.

The pixel separating section 32-1 is disposed in a shape of a same width from the light receiving surface 30a to the surface 30b of the semiconductor layer 30. An upper end of the pixel separating section 32-1 reaches the light receiving surface 30a of the semiconductor layer 30, whereas a lower end of the pixel separating section 32-1 extends to the vicinity of the surface 30b of the semiconductor layer 30. The width of such a pixel separating section 32-1 is uniform from the upper end to the lower end. In addition, sections parallel to the light receiving surface 30a in the pixel separating section 32-1 have a same sectional shape from the upper end to the lower end.

The pixel separating section 32-1 is formed by a material including an impurity. In the present embodiment, description will be made of an example in which the pixel separating section 32-1 is formed by a crystalline semiconductor including an impurity. The pixel separating section 32-1 is formed by recrystallization of an amorphous semiconductor including an impurity which amorphous semiconductor is formed so as to fill a trench disposed in the semiconductor layer 30. The pixel separating section 32-1 therefore has crystallinity inherited from the semiconductor layer 30. That is, as with the semiconductor layer 30, the pixel separating section 32-1 is formed by a crystalline semiconductor, and is for example formed by n-type single crystal or polycrystalline silicon. Such a pixel separating section 32-1 and the semiconductor layer 30 are formed by a continuous crystal structure, and there is no interface at a boundary between the pixel separating section 32-1 and the semiconductor layer 30.

The pixel separating section 32-1 further includes a crystal structure meeting part C. A dotted line part shown in FIG. 2A is the meeting part C. The meeting part C is formed as a result of the amorphous semiconductor including the impurity which amorphous semiconductor is formed so as to fill the trench described above being molten and epitaxially grown from the inner walls of the trench. That is, the meeting part C is a part where epitaxial growth phases from inner walls in two directions meet each other. For example, the meeting part C is disposed in the form of a lattice so as to correspond to the pixel separating section 32-1 surrounding each of the pixels 3 and disposed in the form of a lattice.
[Pixel Separation Joining Section 33]

A pixel separation joining section 33 is disposed in such a position as to separate the photoelectric conversion sections 31 from each other for each of the pixels 3 in the opposite surface layer of the semiconductor layer 30 from the light receiving surface 30a of the semiconductor layer 30, and is an impurity region of the opposite conductivity type (for example a p+ type) from the photoelectric conversion sections 31. This pixel separation joining section 33 is a part provided by introducing an impurity into the semiconductor layer 30 from the side of the surface 30b of the semiconductor layer 30.

This pixel separation joining section 33 is joined to the pixel separating section 32-1. The pixel separation joining section 33 is disposed so as to fill a gap between the pixel separating section 32-1 and the surface 30b of the semiconductor layer 30. Hence, a continuous impurity region formed by the pixel separating section 32-1 and the pixel separation joining section 33 is disposed from the light receiving surface 30a to the surface 30b of the semiconductor layer 30 in regions between adjacent pixels 3.
[Hole Accumulating Layer 34]

A hole accumulating layer 34 is disposed between each of the photoelectric conversion sections 31 and the surface 30b of the semiconductor layer 30 within the semiconductor layer 30, and is an impurity region of the opposite conductivity type (for example a p+ type) from the photoelectric conversion sections 31. The hole accumulating layer 34 is disposed in contact with the photoelectric conversion sections 31. This hole accumulating layer 34 suppresses a dark current caused by an interface state on the side of the surface 30b of the semiconductor layer 30.
[P-Well 35]

P-wells 35 are disposed along the surface 30b of the semiconductor layer 30 so as to be adjacent to a corner of each of the photoelectric conversion sections 31, and are an impurity region of the opposite conductivity type from the photoelectric conversion sections 31. The p-wells 35 are provided as wells of the p-type as opposed to the n-type photoelectric conversion sections 31.

[Floating Diffusion FD]

Floating diffusions FD are disposed along the surface 30b of the semiconductor layer 30 within each of the p-wells 35, and are an impurity region of the same conductivity type (for example an n+ type) as the photoelectric conversion sections 31. The floating diffusions FD are disposed on the side of the surface 30b of the semiconductor layer 30 within each of the p-wells 35 with the p-wells 35 for a predetermined distance between the photoelectric conversion sections 31 and the floating diffusions FD left as a channel region. The floating diffusions FD are electrically separated from the n-type photoelectric conversion sections 31 by the p-wells 35.

[Wiring Layer 20]

The wiring layer 20 is disposed on the surface 30b opposite from the light receiving surface 30a of the semiconductor layer 30. The wiring layer 20 has a transfer gate TG disposed on the surface 30b of the semiconductor layer 30 with a gate insulating film interposed between the transfer gate TG and the surface 30b of the semiconductor layer 30. This transfer gate TG is disposed on the p-well 35 serving as a channel region between the photoelectric conversion section 31 and the floating diffusion FD. The transfer gate TG, the photoelectric conversion section 31, and the floating diffusion FD form a transistor. The transfer gate TG is covered by an interlayer insulating film 25. A multiple layers of wiring 27 are disposed in the interlayer insulating film 25. A part of the wiring 27 is connected to the transfer gate TG and the floating diffusion FD. Such a wiring layer 20 forms a part of a driving circuit for driving the pixel 3.

[Optical Layer 50]

The optical layer 50 is disposed on the light receiving surface 30a of the semiconductor layer 30. This optical layer 50 includes an insulating film 51 disposed on the light receiving surface 30a of the semiconductor layer 30 with an antireflection film not shown in the figures interposed between the insulating film 51 and the light receiving surface 30a of the semiconductor layer 30. The insulating film 51 includes a light shielding film 52 patterned in such a shape as to have openings over the photoelectric conversion sections 31. A color filter layer 53 in which color filters of respective colors are arranged for each of the pixels 3 and an on-chip lens 54 are laminated in this order on the insulating film 51 having such a light shielding film 52 buried therein.

2-2. Effect of First Embodiment

The solid-state imaging element 1-1 according to the first embodiment described above includes the pixel separating section 32-1 in the shape of the same width in a direction of depth from the light receiving surface 30a of the semiconductor layer 30 to the opposite surface 30b. The photoelectric conversion sections 31 are divided from each other for each of the pixels 3 by the pixel separating section 32-1 having such a uniform width in the depth direction. A uniform width of the photoelectric conversion sections 31 is thereby ensured in the depth direction down to the depth over which the pixel separating section 32-1 is disposed. It is thus possible to secure a capacity of the photoelectric conversion sections 31 in the depth direction of the photoelectric conversion sections 31 while ensuring pixel separation. As a result, an amount of saturation charge (Qs) is improved. Therefore the sensitivity of the solid-state imaging element 1-1 can be improved.

In addition, in the solid-state imaging element 1-1 according to the first embodiment, the pixel separating section 32-1 is disposed from the side of the light receiving surface 30a of the semiconductor layer 30 so as to be joined to the pixel separation joining section 33 on the side of the surface 30b of the semiconductor layer 30. This pixel separating section 32-1 forms an impurity region continuous from the light receiving surface 30a to the surface 30b of the semiconductor layer 30, so that reliable pixel separation can be achieved. It is thus possible to prevent a charge obtained by photoelectric conversion from moving between pixels, and consequently suppress color mixture.

Further, in the solid-state imaging element 1-1 according to the first embodiment, the pixel separating section 32-1 has the crystal structure meeting part C. A crystal defect is present in the meeting part C, and the meeting part C functions as a gettering site against metal contamination or the like. It is thus possible to prevent an image defect due to the metal contamination or the like, and thereby improve the reliability of the solid-state imaging element 1-1.

2-3. Method for Manufacturing Solid-State Imaging Element 1-1

FIGS. 3A to 3J are sectional process views of assistance in explaining a method for manufacturing the solid-state imaging element 1-1 according to the first embodiment. The method for manufacturing the solid-state imaging element 1-1 will be described in the following with reference to these drawings.

Figure 3A:
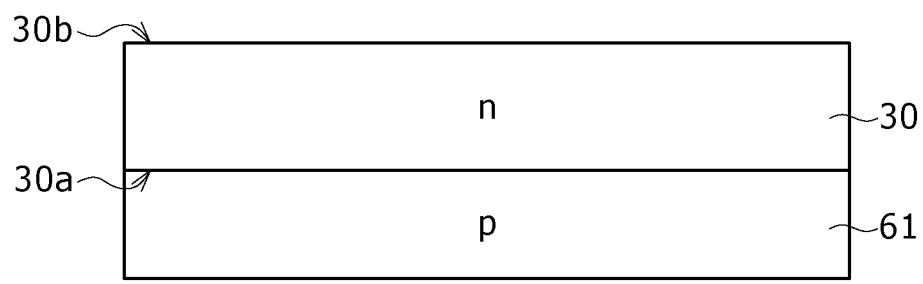
FIGS. 3A to 3J are sectional process views of a method for manufacturing the solid-state imaging element according to the first embodiment.

First, as shown in FIG. 3A, a semiconductor substrate in which a semiconductor layer 30 is disposed on a silicon substrate 61 is prepared. The silicon substrate 61 is of a p-type, and the semiconductor layer 30 is n-type silicon. The semiconductor layer 30 has a surface on the side of the silicon substrate 61 as a light receiving surface 30a, and has a surface on an opposite side from the light receiving surface 30a as a surface 30b. Incidentally, the silicon substrate 61 and the semiconductor layer 30 may be an integrally formed single crystal silicon substrate.

Figure 3B:
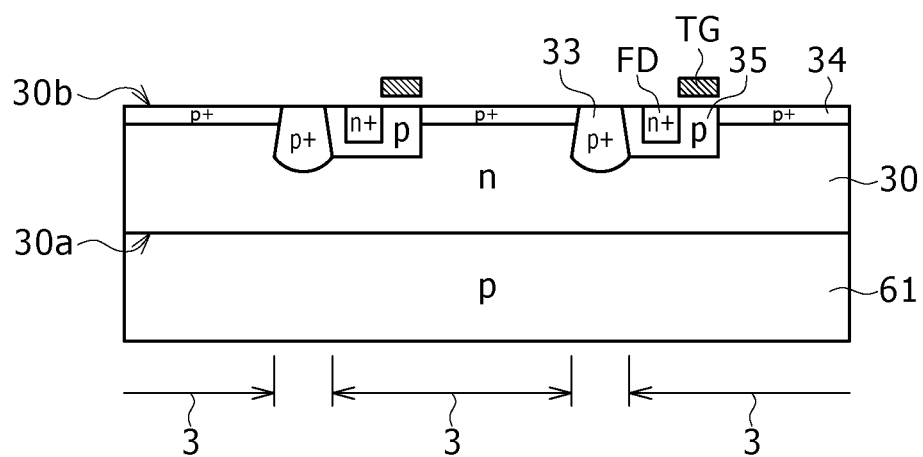

Next, as shown in FIG. 3B, a pixel separation joining section 33, a hole accumulating layer 34, and p-wells 35 are formed as described in the following in a layer on the side of the surface 30b of the semiconductor layer 30.

When the pixel separation joining section 33 is formed, a resist pattern having an opening in regions between adjacent pixels 3 is used as a mask, and an ion implantation is performed from the side of the surface 30b of the semiconductor layer 30. Thereby, boron (B) as an impurity of a p-type that is the opposite conductivity type from the n-type semiconductor layer 30 is introduced into the layer on the side of the surface 30b of the semiconductor layer 30 to form a p+ type pixel separation joining section 33. At this time, the pixel separation joining section 33 is formed to a depth such that a trench can be at least joined to the pixel separation joining section 33 in trench formation to be described later with reference to FIG. 3F. For example, when the semiconductor layer 30 has a depth of 3 μm, the pixel separation joining section 33 is formed to a depth of at least about 300 nm.

When the hole accumulating layer 34 is formed, an ion implantation is performed from the side of the surface 30b of the semiconductor layer 30 using a resist pattern as a mask. Thereby, a p+ type hole accumulating layer 34 is formed in the surface layer part on the side of the surface 30b of the semiconductor layer 30.

When the p-wells 35 are formed, a resist pattern covering the region in which the hole accumulating layer 34 is formed in each of the pixels 3 is used as a mask, and an ion implantation is performed from the side of the surface 30b of the semiconductor layer 30. The p-wells 35 are thereby formed in the layer on the side of the surface 30b of the semiconductor layer 30.

Next, transfer gates TG are formed. At this time, a gate insulating film is formed on the surface 30b of the semiconductor layer 30, and the transfer gates TG are pattern-formed on the gate insulating film. The transfer gates TG are formed over the region of the p-well 35 which region is to become a channel in each of the pixels 3.

Thereafter, floating diffusions FD are formed. At this time, an ion implantation is performed using the transfer gates TG and a resist pattern not shown in the figure as a mask. The floating diffusions FD of an n+ type are thereby formed in the surface layer of the p-wells 35 adjacent to the channel regions under the transfer gates TG.

The above-described ion implantations are not limited to the present example, but may be performed in any order. In addition, after these ion implantations, annealing treatment is performed at a high temperature of 1000° C. to activate the introduced impurities.

Figure 3C:
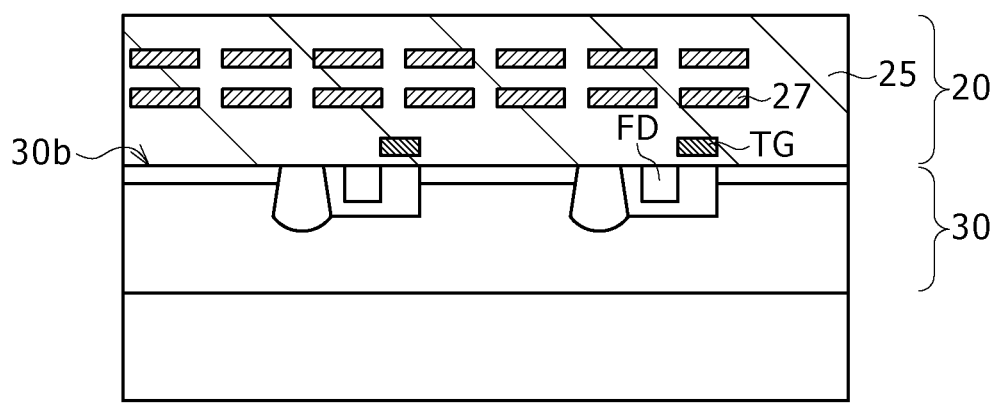

Next, as shown in FIG. 3C, an interlayer insulating film 25 and wiring 27 are formed over the surface 30b of the semiconductor layer 30 in a state of covering the transfer gates TG. At this time, the wiring 27 of a multilayer structure connected to each of the transfer gates TG and the floating diffusions FD is formed by repeating the formation of the interlayer insulating film 25, the formation of a connecting hole in the interlayer insulating film 25, and the formation of the wiring 27. After the wiring 27 in an uppermost layer is formed, the interlayer insulating film 25 covering the wiring 27 in the uppermost layer is formed, whereby the wiring layer 20 is obtained.

The wiring layer 20 is formed on the side of the surface 30b of the semiconductor layer 30 as described above.

Figure 3D:
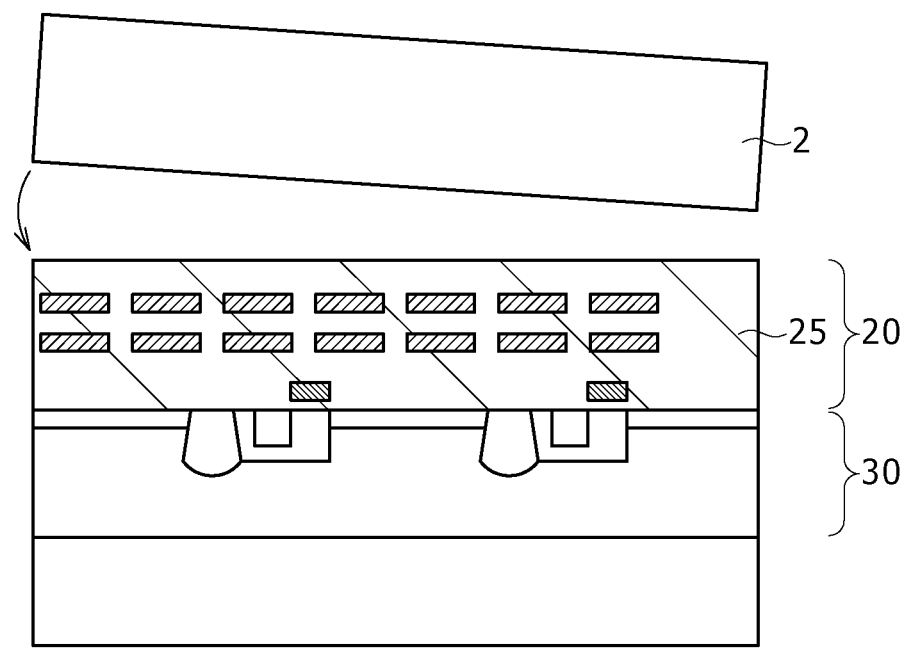

Next, as shown in FIG. 3D, a supporting substrate 2 is laminated onto the interlayer insulating film 25 of the wiring layer 20. At this time, a planarizing layer not shown in the figure is formed on the interlayer insulating film 25, an adhesion layer is next formed on the planarizing layer, and the supporting substrate 2 is laminated onto the adhesion layer via an adhesive.

Figure 3E:
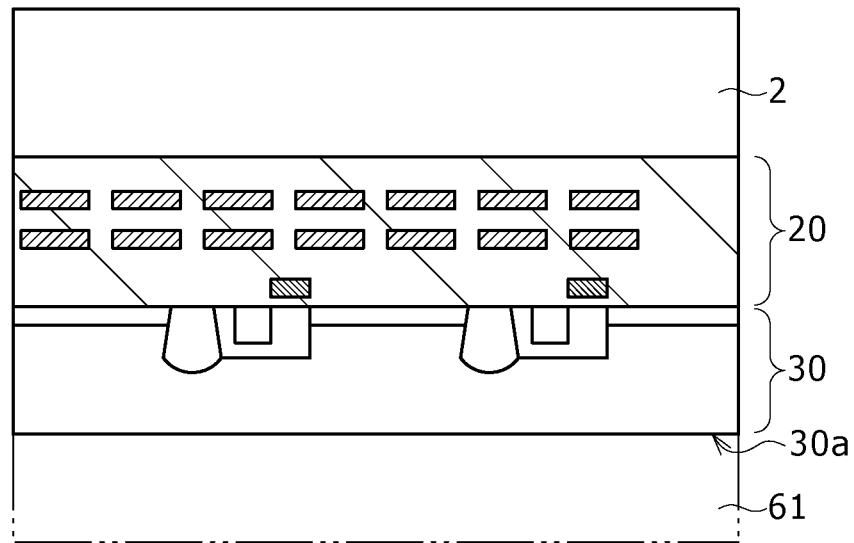
Figure 3F:
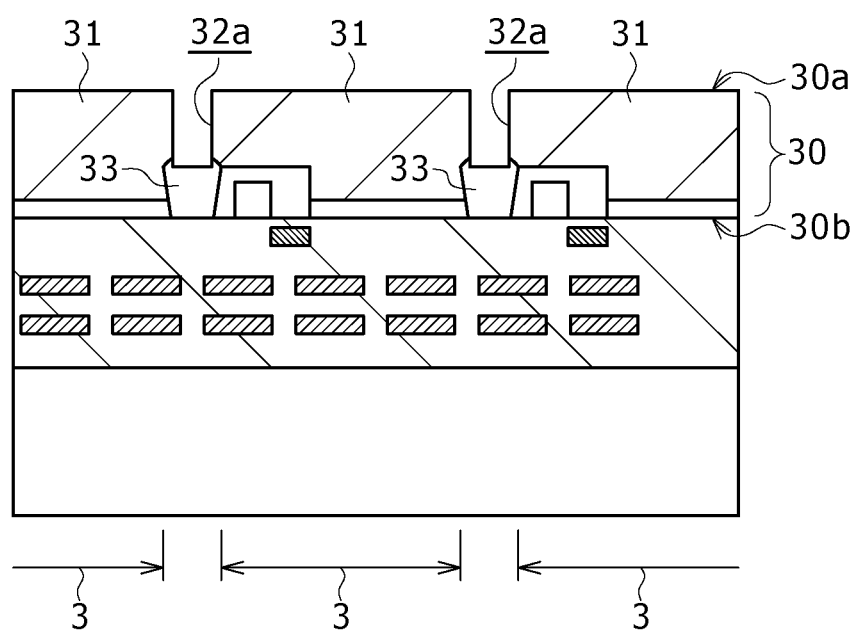

Thereafter, as shown in FIG. 3E, the silicon substrate 61 on the side of the light receiving surface 30a of the semiconductor layer 30 is removed to expose the light receiving surface 30a of the semiconductor layer 30. For example, the silicon substrate 61 is polished by a CMP (Chemical Mechanical Polishing) method to expose the light receiving surface 30a of the semiconductor layer 30.

After the wiring layer 20 is formed as described above, as shown in FIG. 3F, a trench 32a is formed between adjacent pixels 3 from the side of the light receiving surface 30a. At this time, the trench 32a is formed by performing anisotropic etching such for example as an RIE (Reactive Ion Etching) method using a resist pattern covering each of the pixels 3 such that the bottom part of the trench 32a is at least joined to the pixel separation joining section 33. The trench 32a may also be formed such that the bottom part of the trench 32a is in a state of digging in the pixel separation joining section 33. The trench 32a having an opening on the side of the light receiving surface 30a of the semiconductor layer 30 and having such a depth as to be joined to the pixel separation joining section 33 is thereby formed. Then, at the same time as the formation of the trench 32a, the n-type semiconductor layer 30 is separated for each of the pixels 3 by the trench 32a, so that photoelectric conversion sections 31 are formed.

Figure 3G:
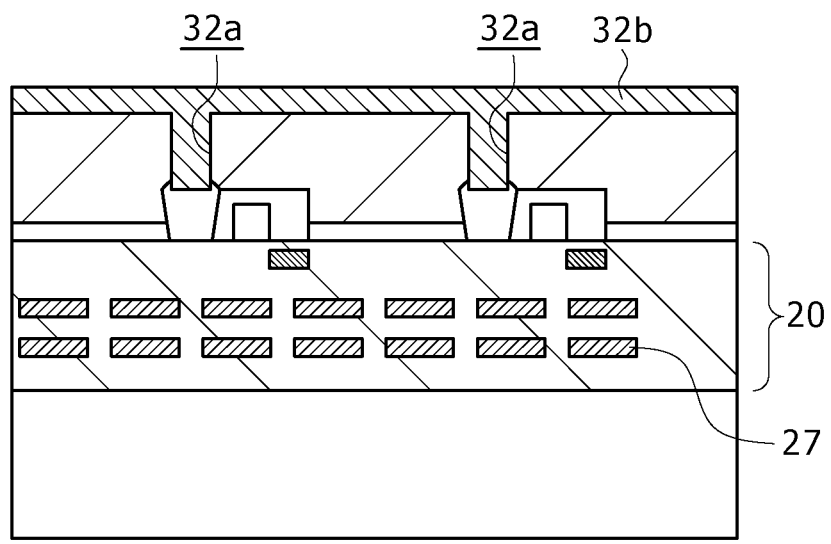

Next, as shown in FIG. 3G, an amorphous semiconductor layer 32b including an impurity of the opposite conductivity type from the photoelectric conversion section 31 is formed as a material layer including an impurity in a state of filling the trench 32a. For example, an amorphous semiconductor film including boron (B) with a concentration of about 1E17 atoms/cm$^3$ is formed. At this time, in consideration of preventing the melting of the wiring 27 in the wiring layer 20 already formed, the amorphous semiconductor layer 32b including the impurity is formed by a film forming method whose process can be performed at a temperature of 400° C. or lower.

Figure 3H:
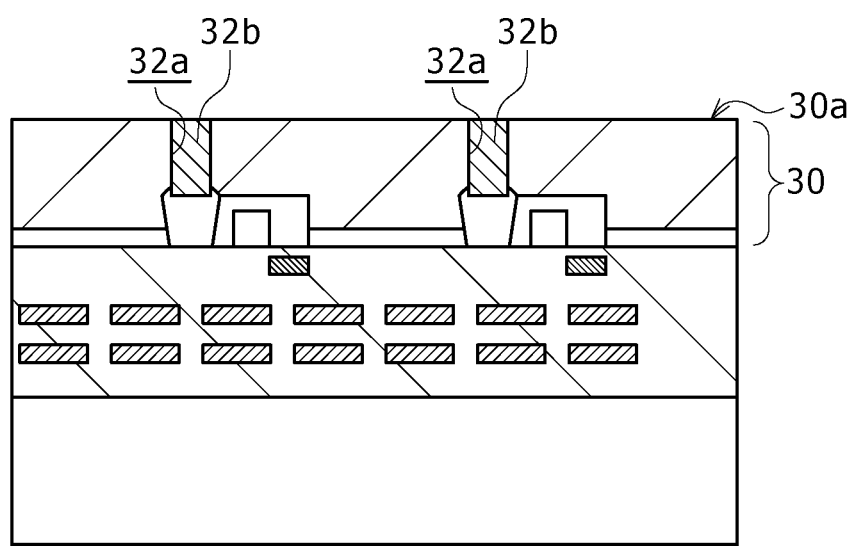

Next, as shown in FIG. 3H, the amorphous semiconductor layer 32b including the impurity which layer is formed on the light receiving surface 30a of the semiconductor layer 30 is removed. For example, the amorphous semiconductor layer 32b including the impurity on the light receiving surface 30a is removed by using a CMP method or the like. The amorphous semiconductor layer 32b including the impurity is thereby left only within the trench 32a.

Figure 3I:
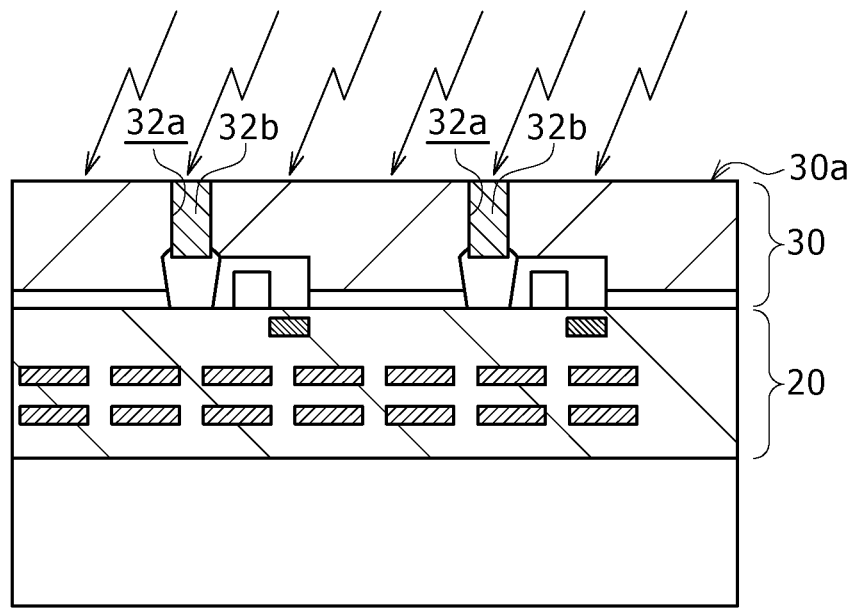

Thereafter, as shown in FIG. 3I, a laser is applied from the side of the light receiving surface 30a of the semiconductor layer 30. This laser annealing selectively heats the semiconductor layer 30 and the amorphous semiconductor layer 32b including the impurity in relation to the wiring layer 20 and further selectively melts the amorphous semiconductor layer 32b including the impurity in relation to the semiconductor layer 30.

At this time, in order not to cause damage to the wiring layer 20 already formed, the laser annealing is performed under conditions that the laser be absorbed by the semiconductor layer 30 and the amorphous semiconductor layer 32b within the trench 32a and that the laser not reach the wiring layer 20. In addition, the laser annealing is performed under a condition that heat conduction from the semiconductor layer 30 and the amorphous semiconductor layer 32b within the trench 32a that are heated by the laser not reach the wiring layer 20.

In this case, the semiconductor layer 30 formed by single crystal silicon, for example, has a melting point of 1410° C., whereas the amorphous semiconductor layer 32b formed by amorphous silicon, for example, has a melting point of 1000 to 1100° C. The laser annealing is performed under conditions for melting the amorphous semiconductor layer 32b without melting such a semiconductor layer 30.

The laser annealing treatment as described above is performed while an irradiation time and a pulse width are adjusted according to the film thickness of the semiconductor layer 30, the type of the laser, and the like. As an example, when a continuous oscillation laser is used, and the semiconductor layer 30 has a film thickness of 3 μm, the laser treatment is performed using the second harmonic of a Nd-YAG laser having a wavelength of 532 nm, for example, with the irradiation time set at 200 nsec. When a pulse oscillation laser is used, and the semiconductor layer 30 has a film thickness of 3 μm, the laser treatment is performed using a XeCl excimer laser having a wavelength of 308 nm, for example, with the pulse width adjusted to about a few ten to a few hundred nsec. Thereby, the semiconductor layer 30 and the amorphous semiconductor layer 32b including the impurity are selectively heated in relation to the wiring layer 20, and further the amorphous semiconductor layer 32b including the impurity is selectively molten in relation to the semiconductor layer 30.

Figure 3J:
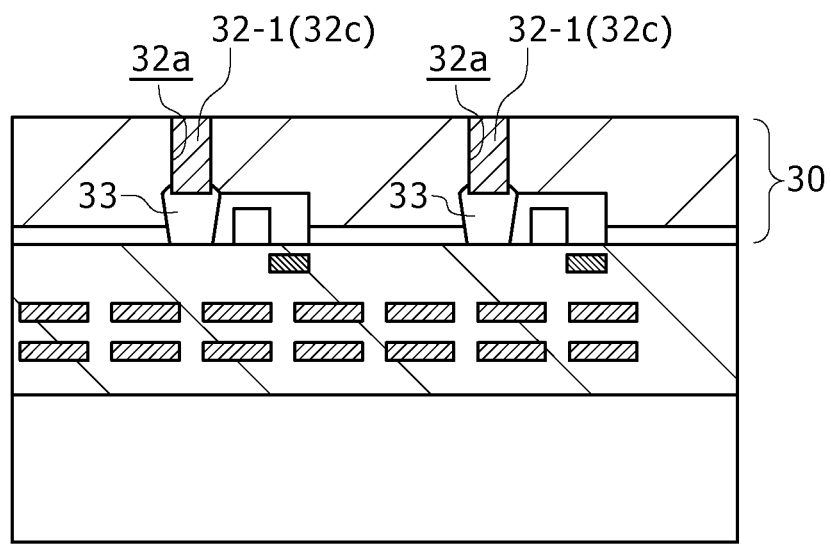

The amorphous semiconductor layer 32b including the impurity is thus selectively molten, and thereafter recrystallized. Thereby, as shown in FIG. 3J, a pixel separating section 32-1 made of a crystalline semiconductor 32c including the impurity is formed. At the time of the recrystallization, the molten amorphous semiconductor layer 32b including the impurity is epitaxially grown from the inner walls of the trench 32a. That is, the pixel separating section 32-1 made of the crystalline semiconductor 32c recrystallized while inheriting the crystal structure of the semiconductor layer 30 exposed to the inner walls of the trench 32a is formed. The pixel separating section 32-1 and the semiconductor layer 30 are thus formed by a crystalline semiconductor of a continuous crystal structure. In addition, there is a part where epitaxial growth phases from all of the inner walls of the trench 32a meet each other. Therefore a crystal structure meeting part is formed within the pixel separating section 32-1.

As a result of the above, as shown in FIG. 3J, the pixel separating section 32-1 joined to the pixel separation joining section 33 and made of the crystalline semiconductor 32c including the impurity is formed.

Incidentally, the process of removing the amorphous semiconductor layer 32b including the impurity on the light receiving surface 30a, which process has been described with reference to FIG. 3H, may be performed after the laser annealing process described with reference to FIG. 3I.

Thereafter, as shown in FIG. 2B, an optical layer 50 is formed on the semiconductor layer 30. At this time, an insulating film 51 is formed on the light receiving surface 30a of the semiconductor layer 30 with an antireflection film interposed between the insulating film 51 and the light receiving surface 30a of the semiconductor layer 30, and a light shielding film 52 is formed on the insulating film 51. This light shielding film 52 is pattern-formed in a shape having openings over the photoelectric conversion sections 31. Next, the insulating film 51 is further formed in a state of burying the light shielding film 52. A color filter layer 53 and an on-chip lens 54 are formed on the insulating film 51. The solid-state imaging element 1-1 is thereby completed.

2-4. Effect of Manufacturing Method According to First Embodiment

In the method for manufacturing the solid-state imaging element 1-1 according to the first embodiment described above, the pixel separating section 32-1 is formed by film formation of the amorphous semiconductor layer 32b including the impurity in such a manner as to fill the trench 32a. The trench 32a is formed by anisotropic etching, and therefore has a shape of a uniform width in the depth direction. The pixel separating section 32-1 formed so as to fill such a trench 32a is formed in a shape of a uniform width in the depth direction. Further, because selective and momentary heating is performed by laser annealing, only the amorphous semiconductor layer 32b including the impurity within the trench 32a is selectively molten, and the semiconductor layer 30 around the trench 32a is momentarily heated but not molten. That is, the impurity does not diffuse into the periphery of the trench 32a, and the pixel separating section 32-1 does not expand. According to the manufacturing method as described above, a minute pixel separating section 32-1 of a uniform width is formed, so that a capacity of the photoelectric conversion sections 31 separated from each other by such a pixel separating section 32-1 can be secured. Thus, an amount of saturation charge (Qs) is improved. Therefore the sensitivity of the solid-state imaging element 1-1 can be improved.

Further, in the method for manufacturing the solid-state imaging element 1-1 according to the first embodiment, the pixel separating section 32-1 is formed after the formation of the wiring layer 20. That is, the pixel separating section 32-1 is formed after high-temperature processing such as activating annealing, silicide formation, and the like is completed first. The impurity does not diffuse and the pixel separating section 32-1 does not expand by being subjected to a high temperature. Thereby, the pixel separating section 32-1 is formed while having a uniform width and retaining a minute shape, and a capacity of the photoelectric conversion sections 31 can be secured. As a result, the amount of saturation charge (Qs) can be further improved.

In addition, in the method for manufacturing the solid-state imaging element 1-1 according to the first embodiment, the pixel separating section 32-1 is formed by recrystallizing the film-formed amorphous semiconductor layer 32b including the impurity. Because the amorphous semiconductor layer 32b uniformly including the impurity with a high concentration can be formed in advance, the pixel separating section 32-1 formed by recrystallizing the amorphous semiconductor layer 32b including the impurity is also formed by the crystalline semiconductor 32c uniformly including the impurity with a high concentration. Such a pixel separating section 32-1 can therefore prevent a leakage of a charge into adjacent pixels and the movement of a charge between adjacent pixels. Thereby color mixture can be suppressed.

Further, in the method for manufacturing the solid-state imaging element 1-1 according to the first embodiment, the pixel separating section 32-1 is formed by recrystallizing the amorphous semiconductor layer 32b including the impurity which is molten within the trench 32a. In addition, the pixel separating section 32-1 is formed with a crystal defect caused in the inner walls of the trench 32a at the time of the etching for forming the trench 32a segregating in the meeting part C due to the recrystallization. The meeting part C including such a crystal defect functions as a gettering site.

3. Second Embodiment 3-1. Constitution of Solid-State Imaging Element 1-2

(Example of Constitution with Pixel Separating Section Disposed Deeper than Photoelectric Conversion Section)

Figure 4A:
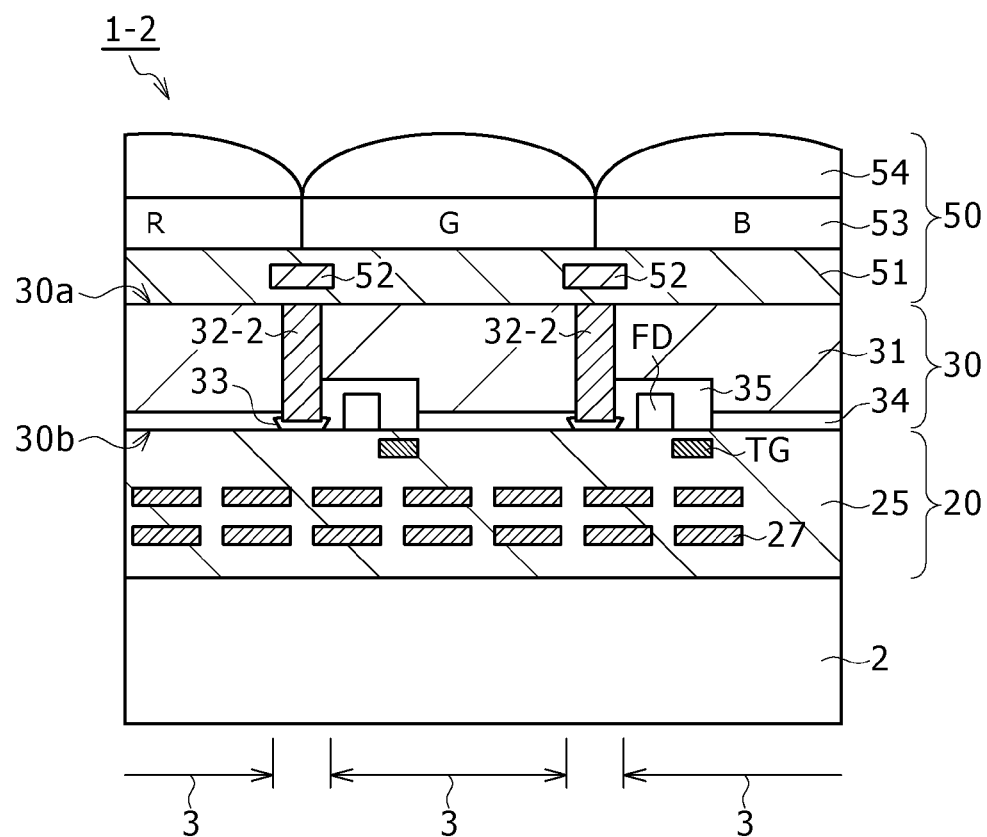
FIGS. 4A and 4B are a fragmentary plan view and an enlarged view of a constitution of a solid-state imaging element according to a second embodiment.
Figure 4B:
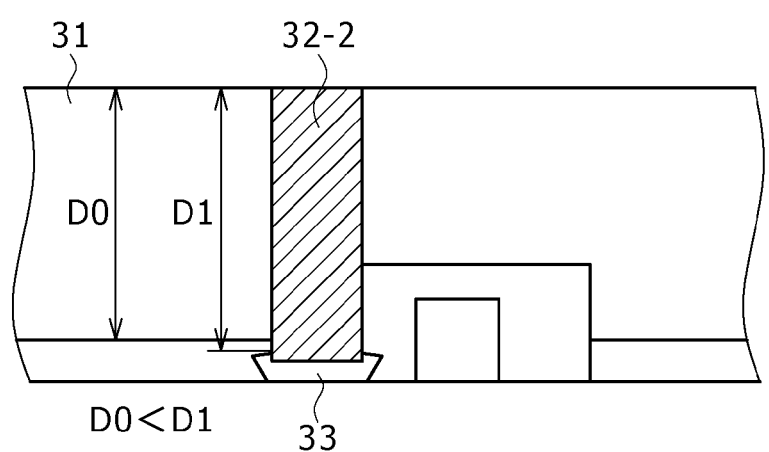

FIGS. 4A and 4B are diagrams showing a constitution of a solid-state imaging element 1-2 according to a second embodiment. FIG. 4A is a diagram of a constitution of principal parts of the solid-state imaging element 1-2. FIG. 4B is an enlarged view of the pixel separating section and vicinities thereof. The solid-state imaging element 1-2 according to the second embodiment shown in FIGS. 4A and 4B is different from the solid-state imaging element according to the first embodiment in that a pixel separating section 32-2 is disposed deeper than photoelectric conversion sections 31. The other constitution of the solid-state imaging element 1-2 according to the second embodiment is similar to that of the solid-state imaging element according to the first embodiment. Repeated description of constituent elements similar to those of the first embodiment will therefore be omitted.

[Pixel Separating Section 32-2]

As shown in FIG. 4A, the pixel separating section 32-2 is disposed to a deeper position than the photoelectric conversion sections 31. As shown in FIG. 4B, supposing that a distance from the light receiving surface 30a of a semiconductor layer 30 is a depth, and letting D1 be the depth of the photoelectric conversion sections 31 and letting D1 be the depth of the pixel separating section 32-2, there is a relation D0<D1. However, D1 represents the length of a part of the pixel separating section 32-2 which part is in contact with the photoelectric conversion sections 31, and does not include the length of a part of the pixel separating section 32-2 which part is embedded in a pixel separation joining section 33. That is, the photoelectric conversion sections 31 are separated from each other for each of pixels 3 by the pixel separating section 32-2. The pixels 3 as a whole are separated from each other by the pixel separating section 32-2 and the pixel separation joining section 33.

3-2. Effect of Second Embodiment

The solid-state imaging element 1-2 according to the second embodiment described above has the pixel separating section 32-2 disposed deeper than the photoelectric conversion sections 31. The pixel separating section 32-2 having a uniform width is disposed over an entire region in the depth direction of the photoelectric conversion sections 31. That is, the photoelectric conversion sections 31 are not in contact with the pixel separation joining section 33 formed by ion implantation. Thereby a maximum capacity of the photoelectric conversion sections 31 can be secured. An amount of saturation charge (Qs) can therefore be further improved.

Incidentally, a method for manufacturing the solid-state imaging element 1-2 having the above-described constitution is similar to the method for manufacturing the solid-state imaging element 1-1 according to the first embodiment.

4. Third Embodiment

4-1. Constitution of Solid-State Imaging Element 1-3

(Example of Constitution Having Interface Impurity Layer Continuous with Pixel Separating Section)

Figure 5:
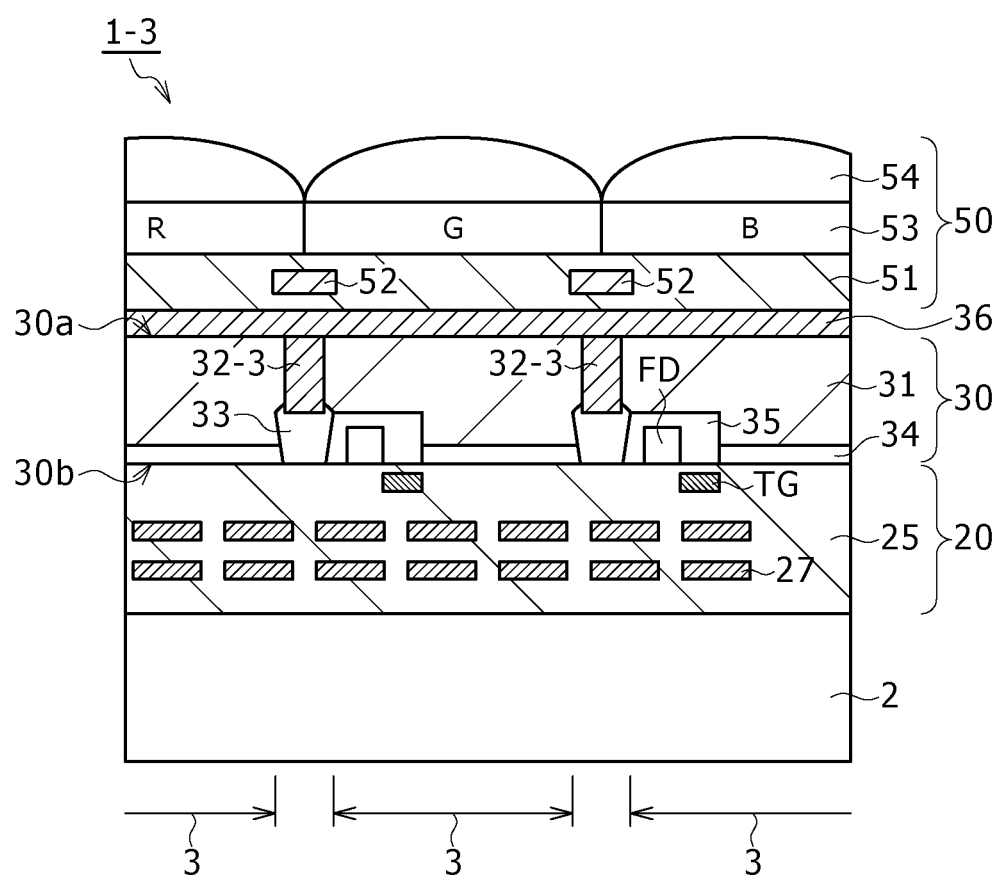
FIG. 5 is a fragmentary sectional view of a constitution of a solid-state imaging element according to a third embodiment.

FIG. 5 is a diagram showing a constitution of a solid-state imaging element 1-3 according to a third embodiment. The solid-state imaging element 1-3 according to the third embodiment shown in FIG. 5 is different from the solid-state imaging element according to the first embodiment in that an interface impurity layer 36 continuous with a pixel separating section 32-3 is disposed on the light receiving surface 30a of a semiconductor layer 30. The other constitution of the solid-state imaging element 1-3 according to the third embodiment is similar to that of the solid-state imaging element according to the first embodiment. Repeated description of constituent elements similar to those of the first embodiment will therefore be omitted.

[Interface Impurity Layer 36]

The interface impurity layer 36 is disposed on the light receiving surface 30a of the semiconductor layer 30 so as to be continuous with the pixel separating section 32-3, and is an impurity region formed by a material including an impurity. The interface impurity layer 36 has crystallinity inherited from the semiconductor layer 30, and is formed by a same crystalline semiconductor as the semiconductor layer 30. The interface impurity layer 36 suppresses a dark current caused by an interface state on the side of the light receiving surface 30a of the semiconductor layer 30.

Incidentally, the pixel separating section 32-3 has a composition similar to that of the pixel separating section 32-1 in the first embodiment.

4-2. Method for Manufacturing Solid-State Imaging Element 1-3

(Method for Forming Pixel Separating Section and Interface Impurity Layer Simultaneously)

Figure 6A:
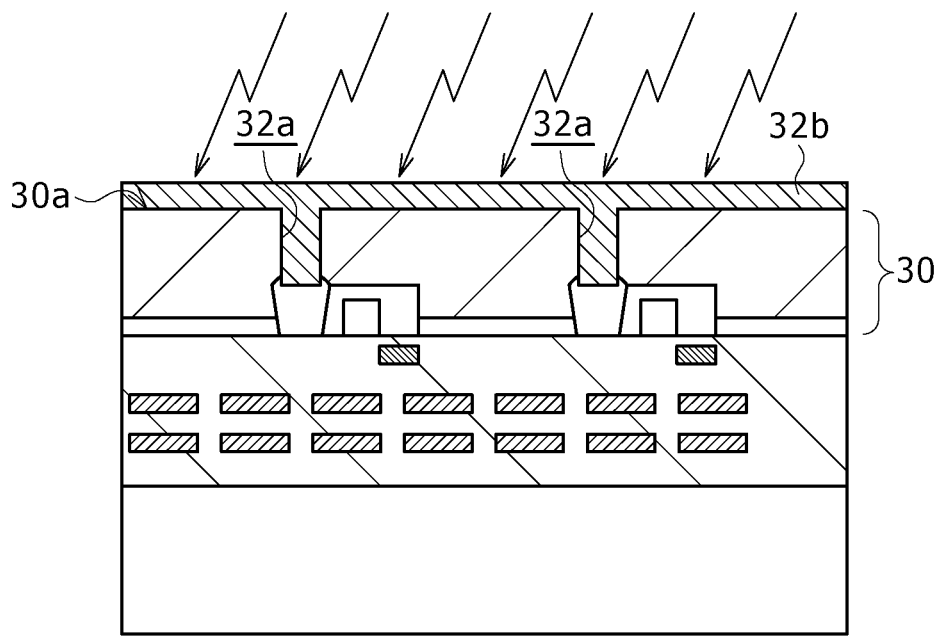
FIGS. 6A and 6B are sectional process views of a method for manufacturing the solid-state imaging element according to the third embodiment.
Figure 6B:
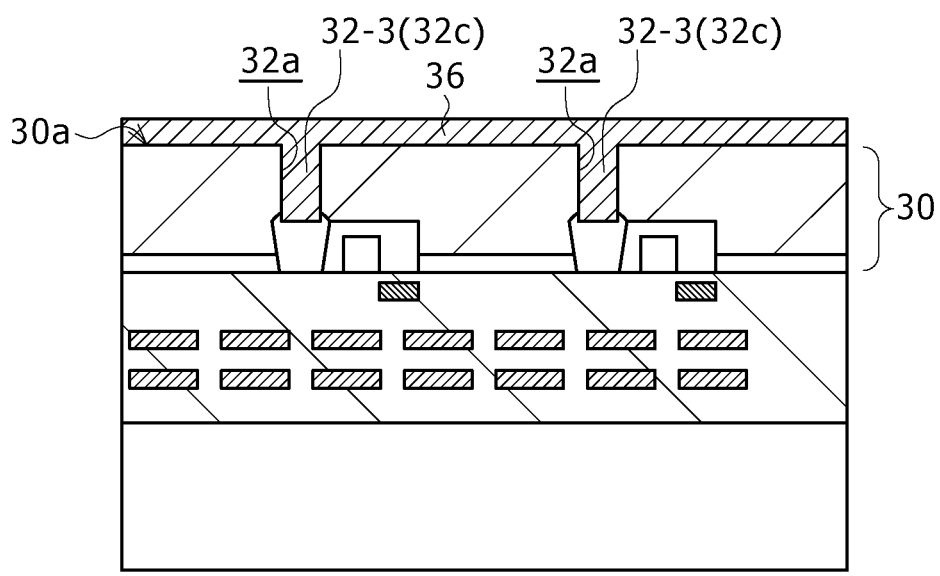

FIGS. 6A and 6B are sectional process views of assistance in explaining characteristic parts of a method for manufacturing the solid-state imaging element 1-3 according to the third embodiment, and are diagrams selectively showing parts changed from those in the method for manufacturing the solid-state imaging element according to the first embodiment. The method for manufacturing the solid-state imaging element 1-3 will be described in the following with reference to the drawings.

First, a procedure similar to that described with reference to FIGS. 3A to 3G in the first embodiment is performed. An amorphous semiconductor layer 32b including an impurity is thereby formed which fills a trench 32a and is also formed on the light receiving surface 30a of a semiconductor layer 30.

Thereafter, as shown in FIG. 6A, a laser is applied from the side of the light receiving surface 30a of the semiconductor layer 30. This laser annealing selectively heats the semiconductor layer 30 and the amorphous semiconductor layer 32b including the impurity in relation to a wiring layer 20 and further selectively melts the amorphous semiconductor layer 32b including the impurity in relation to the semiconductor layer 30. At this time, the laser annealing is performed in a similar manner to that described in the first embodiment.

The amorphous semiconductor layer 32b including the impurity is thus molten, and thereafter recrystallized. Thereby, as shown in FIG. 6B, a pixel separating section 32-3 and an interface impurity layer 36 made of a crystalline semiconductor 32c including the impurity are formed. At this time, the pixel separating section 32-3 is formed within the trench 32a, and the interface impurity layer 36 is formed on the light receiving surface 30a of the semiconductor layer 30. The interface impurity layer 36 is a part epitaxially grown from the side of the light receiving surface 30a of the semiconductor layer 30, and thus has crystallinity inherited from the semiconductor layer 30.

Thereafter, as shown in FIG. 5, an optical layer 50 is formed on the interface impurity layer 36. At this time, an insulating film 51 is formed on the interface impurity layer 36 with an antireflection film interposed between the insulating film 51 and the interface impurity layer 36, and a light shielding film 52 is formed on the insulating film 51. This light shielding film 52 is pattern-formed in a shape having openings over photoelectric conversion sections 31. Next, the insulating film 51 is further formed in a state of burying the light shielding film 52. A color filter layer 53 and an on-chip lens 54 are formed on the insulating film 51. The solid-state imaging element 1-3 is thereby completed.

4-3. Effect of Third Embodiment

The solid-state imaging element 1-3 according to the third embodiment described above has the interface impurity layer 36 on the light receiving surface 30a of the semiconductor layer 30. This interface impurity layer 36 is formed by film formation of the amorphous semiconductor layer 32b including the impurity on the light receiving surface 30a of the semiconductor layer 30 after the formation of the wiring layer 20. Because the interface impurity layer 36 is formed by film formation, the interface impurity layer 36 is formed while the film thickness of the interface impurity layer 36 is controlled. In addition, because the interface impurity layer 36 is formed in a process after the formation of the wiring layer 20, that is, after a process involving high-temperature processing is completed, the impurity does not diffuse and the region does not expand. The interface impurity layer 36 whose film thickness is controlled to be small is thereby formed on the light receiving surface 30a, so that a capacity of the photoelectric conversion sections 31 can be secured as compared with a case where an interface layer is formed by introducing an impurity.

Thus, an amount of saturation charge (Qs) is improved. Therefore the sensitivity of the solid-state imaging element 1-3 can be improved.

In addition, the solid-state imaging element 1-3 according to the third embodiment has the interface impurity layer 36 between the light receiving surface 30a of the semiconductor layer 30 and the optical layer 50. This interface impurity layer 36 suppresses a dark current caused by an interface state on the side of the light receiving surface 30a of the semiconductor layer 30. Thus, the solid-state imaging element 1-3 improved in image quality can be provided.

Further, in the method for manufacturing the solid-state imaging element 1-3 according to the third embodiment, the interface impurity layer 36 is simultaneously formed in the same process as the pixel separating section 32-2. Thus, the interface impurity layer 36 can be formed without an increase in the number of processes.

5. Fourth Embodiment

5-1. Constitution of Solid-State Imaging Element 1-4

(Example of Constitution Having Pixel Separating Section Formed by Insulating Material Including Impurity)

Figure 7:
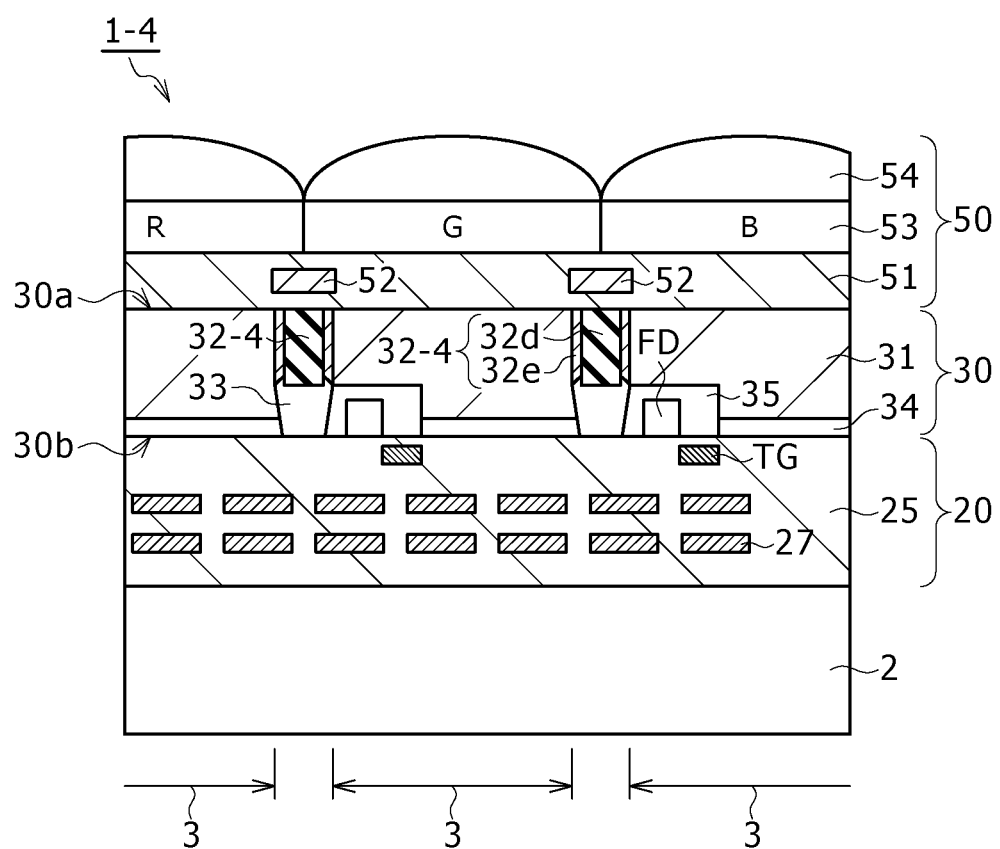
FIG. 7 is a fragmentary sectional view of a constitution of a solid-state imaging element according to a fourth embodiment.

FIG. 7 is a diagram showing a constitution of a solid-state imaging element 1-4 according to a fourth embodiment. The solid-state imaging element 1-4 according to the fourth embodiment shown in FIG. 7 is different from the solid-state imaging element according to the first embodiment in that a pixel separating section 32-4 is formed by an insulating film including an impurity and an impurity region of a side wall. The other constitution of the solid-state imaging element 1-4 according to the fourth embodiment is similar to that of the solid-state imaging element according to the first embodiment. Repeated description of constituent elements similar to those of the first embodiment will therefore be omitted.

[Pixel Separating Section 32-4]

The pixel separating section 32-4 includes an insulating film 32d including an impurity which insulating film is formed so as to be buried in a trench and an impurity region 32e disposed along the side wall of the trench.

The insulating film 32d including the impurity is formed by a silicon oxide film (SiO$_2$) including a p-type impurity, for example. The insulating film 32d including the impurity is a region for electrically separating adjacent photoelectric conversion sections 31 from each other.

The impurity region 32e includes an impurity of a p-type as an opposite conductivity type from the n-type photoelectric conversion sections 31, and is formed by crystalline silicon, for example. The impurity region 32e is a region for electrically separating the adjacent photoelectric conversion sections 31 from each other. The impurity region 32e is also an interface region for suppressing a dark current caused by an interface state between the insulating film 32d and the photoelectric conversion sections 31.

5-2. Method for Manufacturing Solid-State Imaging Element 1-4

Figure 8A:
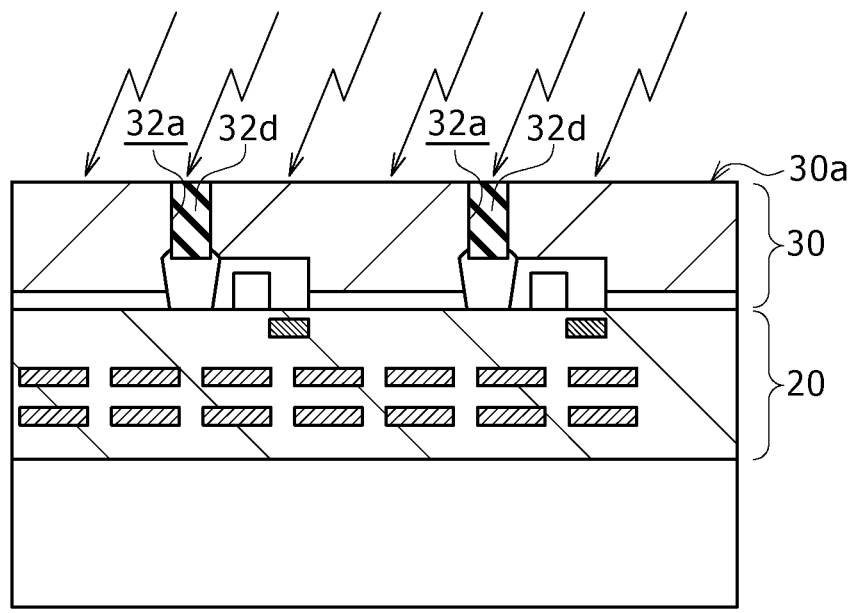
FIGS. 8A and 8B are sectional process views of a method for manufacturing the solid-state imaging element according to the fourth embodiment.
Figure 8B:
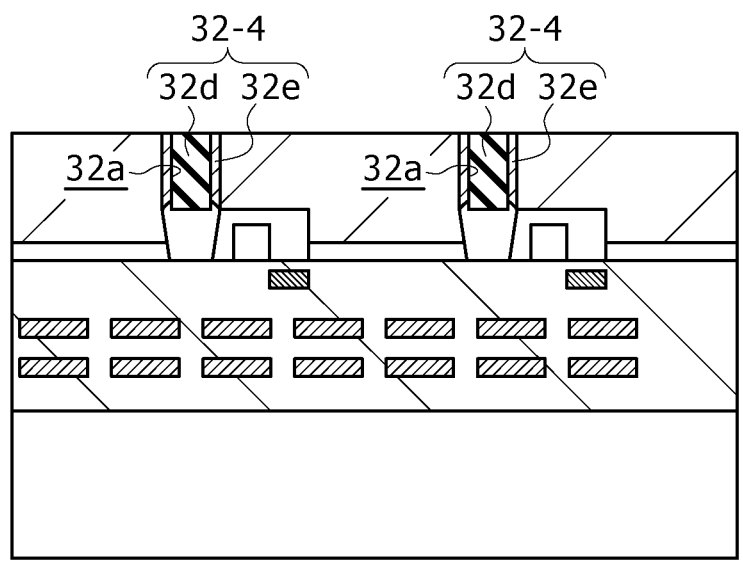

FIGS. 8A and 8B are sectional process views of assistance in explaining characteristic parts of a method for manufacturing the solid-state imaging element 1-4 according to the fourth embodiment, and are diagrams selectively showing parts changed from those in the method for manufacturing the solid-state imaging element according to the first embodiment. The method for manufacturing the solid-state imaging element 1-4 will be described in the following with reference to the drawings.

First, a procedure similar to that described with reference to FIGS. 3A to 3H in the first embodiment is performed. However, in the film formation of FIG. 3G, an insulating film 32d including an impurity is formed in place of an amorphous semiconductor including an impurity. For example, a silicon oxide film 32d including boron (B) as an impurity of the opposite conductivity type from the photoelectric conversion sections 31 is formed. A state of the silicon oxide film 32d including the impurity being embedded within a trench 32a is thereby formed.

Thereafter, as shown in FIG. 8A, a laser is applied from the side of the light receiving surface 30a of a semiconductor layer 30. This laser annealing selectively heats the semiconductor layer 30 and the silicon oxide film 32d including the impurity in relation to a wiring layer 20.

At this time, in order not to cause damage to the wiring layer 20 already formed, the laser annealing is performed under conditions that the laser be absorbed by the semiconductor layer 30 and the silicon oxide film 32d within the trench 32a and that the laser not reach the wiring layer 20. In addition, the laser annealing is performed under a condition that heat conduction from the semiconductor layer 30 and the silicon oxide film 32d within the trench 32a that are heated by the laser not reach the wiring layer 20. In addition, the laser annealing is performed under conditions for heating the silicon oxide film without melting the semiconductor layer 30.

Such a laser annealing treatment diffuses the impurity into the periphery of the trench 32a, and forms an impurity region 32e in the side wall part of the trench 32a, as shown in FIG. 8B. As a result of the above, a pixel separating section 32-4 composed of the insulating film (silicon oxide film) 32d including the impurity within the trench 32a and the impurity region 32e in the side wall of the trench 32a is formed.

Thereafter, as shown in FIG. 7, an optical layer 50 is formed on the light receiving surface 30a of the semiconductor layer 30 as in the manufacturing method according to the first embodiment. The solid-state imaging element 1-4 is thereby completed.

5-3. Effect of Fourth Embodiment

The solid-state imaging element 1-4 according to the fourth embodiment described above has a structure in which the pixel separating section 32-4 includes the impurity region 32e disposed along the side wall of the trench. This impurity region 32e is a part formed in the side wall of the trench 32a by the diffusion of the impurity at the time of the heating of the semiconductor layer 30 and the silicon oxide film 32d including the impurity within the trench 32a by laser annealing. At the time of the laser annealing, the semiconductor layer 30 is heated but not molten, and is only heated momentarily, so that the impurity is diffused into a very narrow area. That is, the impurity region 32e is formed as a very thin film. Thus, because the impurity region 32e of the pixel separating section 32-4 is a very thin film, a capacity of the photoelectric conversion sections 31 can be secured. This improves an amount of saturation charge (Qs). Therefore the sensitivity of the solid-state imaging element 1-4 can be improved.

Further, the solid-state imaging element 1-4 according to the fourth embodiment has a structure in which the impurity region 32e of the pixel separating section 32-4 is formed by crystalline silicon including an impurity. In addition, there is an interface at a boundary between the silicon oxide film 32d including the impurity which silicon oxide film 32d forms the pixel separating section 32-4 and the crystalline silicon forming the semiconductor layer 30. However, the impurity region 32e of the opposite conductivity type from the photoelectric conversion sections 31 is provided at the part of the boundary. Therefore a dark current caused by an interface state can be suppressed.

Incidentally, the present fourth embodiment can be combined with the second embodiment or the third embodiment described above. That is, the pixel separating section 32-4 may be disposed deeper than the photoelectric conversion sections 31. In addition, an interface impurity layer formed so as to be continuous with the pixel separating section 32-4 may be disposed on the light receiving surface 30a of the semiconductor layer 30.

In addition, in the foregoing first to fourth embodiments, constitutions including the pixel separation joining section 33 have been described. This pixel separation joining section 33 is a part for separating the pixels 3 from each other together with the pixel separating section 32. However, such a pixel separation joining section 33 may be omitted. In this case, when the trench 32a is formed from the side of the light receiving surface 30a, a distance between the bottom part of the trench 32a and the surface 30b of the semiconductor layer 30 is shortened. When laser annealing thereafter selectively heats the semiconductor layer 30 and the material layer including the impurity within the trench 32a in relation to the wiring layer 20, the impurity is diffused, and the pixel separating section 32 is thereby made to reach the surface 30b of the semiconductor layer 30. However, the laser annealing is a momentary heating, and the impurity is diffused into a very narrow area. Therefore, when the trench 32a can be formed to a depth such that the distance between the bottom part of the trench 32a and the surface 30b of the semiconductor layer 30 is shortened to be able to be covered by the above-described diffusion of the impurity, the pixel separation joining section 33 can be omitted.

6. Fifth Embodiment

Example of Electronic Device Using Solid-State Imaging Element

The solid-state imaging elements according to the foregoing embodiments of the present technology are applicable to electronic devices such for example as camera systems including digital cameras, video cameras, and the like, portable telephones having an imaging function, or other devices having an imaging function.

Figure 9:
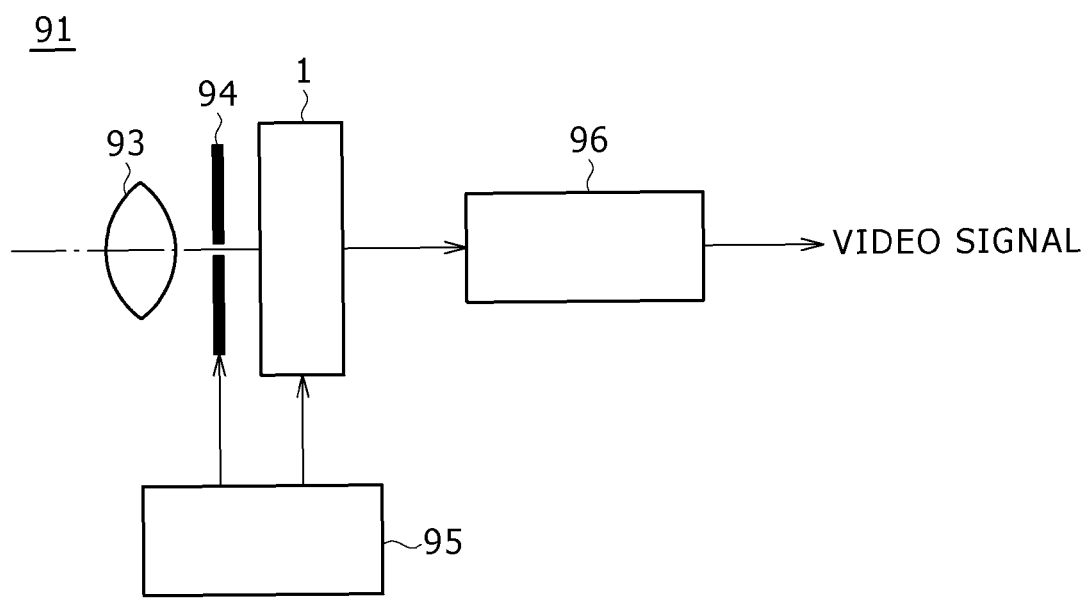
FIG. 9 is a diagram of a constitution of an electronic device using a solid-state imaging element obtained by applying the present technology.

FIG. 9 is a diagram of a constitution of a camera using a solid-state imaging element as an example of an electronic device according to an embodiment of the present technology. The camera according to the example of the present embodiment is, as an example, a video camera capable of photographing a still image or a moving image. This camera 91 includes: a solid-state imaging element 1; an optical system 93 for guiding incident light to the light receiving sensor section of the solid-state imaging element 1; a shutter device 94; a driving circuit 95 for driving the solid-state imaging element 1; and a signal processing circuit 96 for processing the output signal of the solid-state imaging element 1.

One of the solid-state imaging elements having the constitutions described in the foregoing embodiments is applied as the solid-state imaging element 1. The optical system (optical lens) 93 forms image light (incident light) from a subject onto the imaging surface of the solid-state imaging element 1. A signal charge is thereby accumulated within the solid-state imaging element 1 for a certain period. Such an optical system 93 may be an optical lens system formed by a plurality of optical lenses. The shutter device 94 controls a period of irradiation of the solid-state imaging element 1 with light and a period of shielding of the solid-state imaging element 1 from light. The driving circuit 95 supplies a driving signal to the solid-state imaging element 1 and the shutter device 94, and controls an operation of outputting a signal to the signal processing circuit 96 by the solid-state imaging element 1 and controls the shutter operation of the shutter device 94 by the supplied driving signal (timing signal). That is, the driving circuit 95 performs an operation of transferring the signal from the solid-state imaging element 1 to the signal processing circuit 96 by supplying the driving signal (timing signal). The signal processing circuit 96 subjects the signal transferred from the solid-state imaging element 1 to various kinds of signal processing. A video signal resulting from the signal processing is stored on a storage medium such as a memory or the like, or output to a monitor.

According to the electronic device according to the present embodiment described above, one of the solid-state imaging elements having excellent light receiving characteristics as described in the foregoing first to fourth embodiments is used, and thereby high-definition imaging and miniaturization in the electronic device having an imaging function can be achieved.

Incidentally, the present technology can also adopt the following constitutions.

(1) A solid-state imaging element including:
a semiconductor layer;
a plurality of photoelectric conversion sections arranged within the semiconductor layer; and
a pixel separating section disposed in a shape of a same width from a light receiving surface of the semiconductor layer to an opposite surface of the semiconductor layer from the light receiving surface in a position of separating the photoelectric conversion sections from each other for each pixel, the pixel separating section being formed by a material including an impurity.

(2) The solid-state imaging element according to (1), wherein the pixel separating section is formed by a crystalline semiconductor including the impurity.

(3) The solid-state imaging element according to (1) or (2), wherein the pixel separating section is formed by recrystallizing an amorphous semiconductor including the impurity, the amorphous semiconductor including the impurity being formed so as to fill a trench disposed in the semiconductor layer.

(4) The solid-state imaging element according to any one of (1) to (3), wherein the pixel separating section has crystallinity inherited from the semiconductor layer.

(5) The solid-state imaging element according to any one of (1) to (4), wherein the pixel separating section has a crystal structure meeting part formed by melting an amorphous semiconductor including the impurity, the amorphous semiconductor including the impurity being formed so as to fill a trench disposed in the semiconductor layer, and epitaxially growing the molten amorphous semiconductor from inner walls of the trench.

(6) The solid-state imaging element according to any one of (1) to (5), further including
an interface impurity layer disposed on the light receiving surface of the semiconductor layer so as to be continuous with the pixel separating section, the interface impurity layer being formed by the material including the impurity.

(7) The solid-state imaging element according to any one of (1) to (6), further including a pixel separation joining section disposed in a position of separating the photoelectric conversion sections from each other for each pixel in an opposite surface layer of the semiconductor layer from the light receiving surface of the semiconductor layer, and joined to the pixel separating section.

(8) The solid-state imaging element according to (1), wherein the pixel separating section includes
an insulating film including the impurity, the insulating film including the impurity being formed so as to fill a trench disposed in the semiconductor layer, and
an impurity region disposed along side walls of the trench.

(9) The solid-state imaging element according to any one of (1) to (8), further including
a wiring layer on the opposite surface of the semiconductor layer from the light receiving surface of the semiconductor layer.

(10) A method for manufacturing a solid-state imaging element, the method including:
arranging and forming a plurality of photoelectric conversion sections within a semiconductor layer;
forming a wiring layer on an opposite surface side of the semiconductor layer from a light receiving surface of the semiconductor layer;
forming a trench having an opening on a side of the light receiving surface of the semiconductor layer in a position of separating the photoelectric conversion sections from each other for each pixel after forming the wiring layer;
forming a material layer including an impurity in a state of filling the trench; and
forming a pixel separating section by selectively heating the semiconductor layer and the material layer including the impurity in relation to the wiring layer.

(11) The method for manufacturing the solid-state imaging element according to (10), wherein laser annealing is used when the semiconductor layer and the material layer including the impurity are selectively heated in relation to the wiring layer.

(12) The method for manufacturing the solid-state imaging element according to (10) or (11), wherein
an amorphous semiconductor layer including the impurity is formed as the material layer including the impurity, and
when the pixel separating section is formed, the amorphous semiconductor layer including the impurity is selectively molten in relation to the semiconductor layer by using laser annealing, and recrystallized by epitaxial growth.

(13) The method for manufacturing the solid-state imaging element according to any one of (10) to (12), wherein
when the material layer including the impurity is formed, the material layer including the impurity is formed in the state of filling the trench and also formed on the light receiving surface, and
the material layer including the impurity on the light receiving surface is then removed, leaving the material layer including the impurity within the trench.

(14) The method for manufacturing the solid-state imaging element according to (13), wherein the material layer including the impurity on the light receiving surface is removed before the semiconductor layer and the material layer including the impurity are selectively heated in relation to the wiring layer.

(15) The method for manufacturing the solid-state imaging element according to any one of (10) to (14), wherein
when the material layer including the impurity is formed, the material layer including the impurity is formed in the state of filling the trench and also formed on the light receiving surface of the semiconductor layer, and when the pixel separating section is formed, the pixel separating section is formed within the trench and an interface impurity layer is formed on the light receiving surface by selectively heating the semiconductor layer and the material layer including the impurity in relation to the wiring layer.

(16) The method for manufacturing the solid-state imaging element according to any one of (10) to (15), further including:
forming a pixel separation joining section in a surface layer of the semiconductor layer by performing ion implantation into the semiconductor layer from the opposite surface side of the semiconductor layer from the light receiving surface of the semiconductor layer before forming the wiring layer;
wherein when the trench is formed, the trench is formed so as to be joined to the pixel separation joining section.

(17) The method for manufacturing the solid-state imaging element according to (10), wherein
an insulating film including the impurity is formed as the material layer including the impurity, and
when the pixel separating section is formed, the pixel separating section composed of the insulating film including the impurity within the trench and an impurity region disposed along side walls of the trench is formed by selectively heating the semiconductor layer and the material layer including the impurity in relation to the wiring layer by using laser annealing and diffusing the impurity into the side walls of the trench.

(18) An electronic device including:
a semiconductor layer;
a plurality of photoelectric conversion sections arranged within the semiconductor layer;
a pixel separating section disposed in a shape of a same width from a light receiving surface of the semiconductor layer to an opposite surface of the semiconductor layer from the light receiving surface in a position of separating the photoelectric conversion sections from each other for each pixel, the pixel separating section being formed by a material including an impurity; and
an optical system for guiding incident light to the photoelectric conversion sections.

The present disclosure contains subject matter related to that disclosed in Japanese Priority Patent Application JP 2012-016263 filed in the Japan Patent Office on Jan. 30, 2012, the entire content of which is hereby incorporated by reference.

It should be understood by those skilled in the art that various modifications, combinations, sub-combinations and alternations may occur depending on design requirements and other factors insofar as they are within the scope of the appended claims or the equivalent thereof.

What is claimed is:

1. A solid-state imaging element comprising:
a semiconductor layer;
a plurality of photoelectric conversion sections arranged within the semiconductor layer; and
a pixel separating section having uniform width from a light receiving surface of the semiconductor layer to an opposite surface of the semiconductor layer from the light receiving surface and disposed in a position separating the photoelectric conversion sections from each other for each pixel, the pixel separating section being formed by a crystalline semiconductor including an impurity.

2. The solid-state imaging element according to claim 1, wherein the pixel separating section has crystallinity inherited from the semiconductor layer.

3. The solid-state imaging element according to claim 1, further comprising an interface impurity layer disposed on the light receiving surface of the semiconductor layer so as to be continuous with the pixel separating section, the interface impurity layer being formed by the crystalline semiconductor including the impurity.

4. The solid-state imaging element according to claim 1, further comprising a pixel separation joining section disposed in a position of separating the photoelectric conversion sections from each other for each pixel in the opposite surface layer of the semiconductor layer from the light receiving surface of the semiconductor layer, and joined to the pixel separating section.

5. The solid-state imaging element according to claim 1, wherein the pixel separating section includes an insulating film including the impurity, the insulating film including the impurity being formed so as to fill a trench disposed in the semiconductor layer, and an impurity region disposed along side walls of the trench.

6. The solid-state imaging element according to claim 1, further comprising a wiring layer on the opposite surface of the semiconductor layer from the light receiving surface of the semiconductor layer.

7. An electronic device comprising:
a semiconductor layer;
a plurality of photoelectric conversion sections arranged within the semiconductor layer;
a pixel separating section having uniform width from a light receiving surface of the semiconductor layer to an opposite surface of the semiconductor layer from the light receiving surface and disposed in a position separating the photoelectric conversion sections from each other for each pixel, the pixel separating section being formed by a crystalline semiconductor including an impurity; and an optical system for guiding incident light to the photoelectric conversion sections.

8. A solid-state imaging element comprising:
a semiconductor layer;
a plurality of photoelectric conversion sections arranged within the semiconductor layer; and
a pixel separating section having uniform width from a light receiving surface of the semiconductor layer to an opposite surface of the semiconductor layer from the light receiving surface and disposed in a position separating the photoelectric conversion sections from each other for each pixel, the pixel separating section being formed by an amorphous semiconductor including an impurity.

9. The solid-state imaging element according to claim 8, wherein the pixel separating section is formed by recrystallizing the amorphous semiconductor including the impurity, the amorphous semiconductor including the impurity being formed so as to fill a trench disposed in the semiconductor layer.

10. The solid-state imaging element according to claim 8, wherein the pixel separating section has a crystal structure meeting part formed by:
melting the amorphous semiconductor including the impurity, the amorphous semiconductor including the impurity being formed so as to fill a trench disposed in the semiconductor layer, and
epitaxially growing the molten amorphous semiconductor from inner walls of the trench.

* * * * *